United States Patent
Furumiya et al.

(10) Patent No.: US 6,525,355 B2
(45) Date of Patent: Feb. 25, 2003

(54) SOLID-STATE IMAGE SENSOR PROVIDED WITH DIVIDED PHOTOELECTRIC CONVERSION PART

(75) Inventors: Masayuki Furumiya, Tokyo (JP); Yasutaka Nakashiba, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/047,155

(22) Filed: Jan. 14, 2002

(65) Prior Publication Data

US 2002/0093015 A1 Jul. 18, 2002

(30) Foreign Application Priority Data

Jan. 15, 2001 (JP) ........................................ 2001-006239

(51) Int. Cl.[7] ........................................... H01L 27/146
(52) U.S. Cl. ........................................ 257/292; 257/239
(58) Field of Search ................................. 257/239, 291, 257/292

(56) References Cited

U.S. PATENT DOCUMENTS

| | | | | |
|---|---|---|---|---|
| 4,993,053 A | * | 2/1991 | Itoh et al. | 257/239 |
| 5,903,021 A | * | 5/1999 | Lee et al. | 257/292 |
| 5,949,061 A | * | 9/1999 | Guidash et al. | 257/291 |
| 5,977,576 A | * | 11/1999 | Hamasaki | 257/292 |
| 6,051,447 A | * | 4/2000 | Lee et al. | 257/292 |
| 6,100,551 A | * | 8/2000 | Lee et al. | 257/292 |
| 6,310,369 B1 | * | 10/2001 | Narabu et al. | 257/239 |

OTHER PUBLICATIONS

Nikkei Microdevice, Jul. 1997, pps 120–125 (CMOS manufacturing process).

* cited by examiner

Primary Examiner—Gene M. Munson
(74) Attorney, Agent, or Firm—Hayes Soloway P.C.

(57) ABSTRACT

A solid-state image sensor compatible with a CMOS manufacturing process outputs the variation of the electric potential according to the number of accumulated electrons of a photoelectric conversion part, however, if the parasitic capacity of the photoelectric conversion part is C and the output voltage is V, V=Q/C and the solid-state image sensor has a defect that when the area of the photoelectric conversion part is simply increased to enhance the sensitivity, the parasitic capacity C is increased in proportion and the variation V of the electric potential by signal charges cannot be increased to an expected degree. A photoelectric conversion part is divided into a first region and a second region formed next to the first region, MOSFET for setting constant potential using a P-type well layer between the first region and the second region for a channel region is provided, in case a channel region of MOSFET for control is formed by the P-type well layer between the second region and a drain of conventional type MOSFET for control, a two-stage incident light quantity-output voltage characteristic can be acquired for the quantity of incident light and the sensitivity at low illuminance can be enhanced.

20 Claims, 13 Drawing Sheets

US 6,525,355 B2

SOLID-STATE IMAGE SENSOR PROVIDED WITH DIVIDED PHOTOELECTRIC CONVERSION PART

BACKGROUND OF THE INVENTION

1. Field of the Invention

The present invention relates to a solid-state image sensor, particularly relates to a solid-state image sensor provided with a divided photoelectric conversion part.

2. Description of the Related Art

Recently, a solid-state image sensor used for a digital camera, digital VTR and others has attracted a great deal of attention. Heretofore, a solid-state image sensor was roughly classified into a MOS type and a CCD type according to a system of a transport layer for transferring a photoelectrically converted signal charge.

Of these solid-state image sensors, particularly a CCD-type solid-state image sensor has been recently used for electronic equipment such as camera-integrated VTR, a digital camera and a facsimile and technical development for enhancing the characteristics is still currently made.

For one of such solid-state image sensors, there is a solid-state image sensor compatible with a CMOS manufacturing process (hereinafter called a CMOS sensor) (for example, refer to pages 120 to 125 in the July number in 1997 of the Nikkei Microdevice). This CMOS sensor can be operated by a single power source of 5 V or 3.3 V and is provided with characteristics that the power consumption is low, the CMOS sensor can be manufactured in a general CMOS manufacturing process, can be mounted in the identical chip together with a signal processing circuit and other peripheral circuits and is compatible with a CMOS manufacturing process.

FIGS. 10A and 11A are sectional views respectively showing a basic cell (picture element) of a CMOS sensor. FIG. 10B is a potential phase diagram when signal charges are accumulated in a photoelectric conversion part and FIG. 11B is a potential phase diagram when signal charges in the photoelectric conversion part are reset.

As shown in FIG. 10A, the basic cell (picture element) of the CMOS sensor is provided with a P-type semiconductor substrate 301, a P-type well layer 302 which is formed inside the P-type semiconductor substrate 301 and a part of which is exposed on the surface of the P-type semiconductor substrate 301, P+-type semiconductor regions 303 and 323 formed on the P-type well layer 302, exposed on the surface of the P-type semiconductor substrate 301 and functioning as an element separating region, an N+-type semiconductor region 306 surrounded by the P-type well layer 302 and the P+-type semiconductor region 303 and functioning as a photoelectric conversion part, an N+-type semiconductor region 305 surrounded by the P-type well layer 302 and the P+-type semiconductor region 323 and functioning as a drain of MOSFET for control 401, the MOSFET for control 401 having a gate electrode located opposite to the exposed surface of the P-type well layer 302 exposed on the surface of the P-type semiconductor substrate 301, first MOSFET 402 functioning as a source-follower amplifier and second MOSFET 403 functioning as a horizontal selecting switch.

The basic cell of the CMOS sensor is connected to an external circuit via the second MOSFET 403.

The external circuit is composed of third load MOSFET 404 that receives the load of the source-follower amplifier, MOSFET for transferring dark output 405, MOSFET for transferring light output 406, a capacitor for accumulating dark output 407 connected to a source or a drain of the MOSFET for transferring dark output 405 and a capacitor for accumulating light output 408 connected to a source or a drain of the MOSFET for transferring light output 406.

The second MOSFET 403 is connected to the third load MOSFET 404. The MOSFET for transferring dark output 405 and the MOSFET for transferring light output 406 are connected to a node between the second MOSFET 403 and the third load MOSFET 404.

The first MOSFET 402, the second MOSFET 403 and the third load MOSFET 404 are connected in series between line sources VDD and VSS. The N+-type semiconductor region 306 is connected to a gate of the first MOSFET 402.

The P+-type semiconductor regions 303 and 323 are grounded and the N+-type semiconductor region 305 is connected to a line source VDD.

The basic cell 450 shown as a picture element in FIGS. 10 and 11 of the CMOS sensor is arranged in a matrix and a CMOS cell series is formed. Each basic cell 450 is connected to vertical registers (V-registers) 451, horizontal registers (H-registers) 452, the load transistor 404 and an output line 453 as shown in FIG. 12A.

The load transistor 404 shown in FIG. 12A is identical to the load MOSFET 404 shown in FIGS. 10 and 11.

The output line 453 is connected to each MOSFET 405, 406 and each capacitor 407, 408 respectively shown in FIGS. 10 and 11 via vertical selecting switch MOSFET 455 as a vertical selecting switch selected by the horizontal register 452.

FIG. 12B shows connection inside the basic cell (or a picture element) and the same reference number is allocated to a component corresponding to that in FIGS. 10 and 11. As shown in FIG. 12B, a control pulse φR is input to a gate of the MOSFET for control 401, an address signal X is input to a gate of the second MOSFET 403 and the load transistor 404 and the output line 453 are connected to a source of the second MOSFET 403.

Next, referring to FIGS. 10 and 11, a method of operating the CMOS sensor configured as described above will be described.

First, as shown in FIG. 11, the control pulse φR applied to the gate of the MOSFET for control 401 in reset time is set to the voltage of a high level and the N+-type semiconductor region 306 is reset to source voltage VDD.

As shown in FIG. 10 after a reset is finished, the control pulse φR to the MOSFET for control 401 is set to the voltage of a low level.

In the N+-type semiconductor region 306 that functions as a photoelectric conversion part, kTC noise is caused by the reset, however, this can be removed by sampling and accumulating dark output before signal charges are transferred and eliminating difference between the dark output and light output.

In the succeeding accumulation period of signal charges, in the N+-type semiconductor region 306 that functions as a photoelectric conversion part, when an electron-hole pair is caused by incident light, electrons are accumulated in a depletion layer and the hole is discharged via the P-type well layer 302. Grid-like hatching showing electric potential lower than the source voltage VDD shows that this region is not depleted.

The electric potential of the N+-type semiconductor region 306 that functions as a photoelectric conversion part varies according to the number of accumulated electrons. A photoelectric transfer characteristic satisfactory in linearity can be acquired by outputting the variation of the electric potential to the second MOSFET 403 via the source of the first MOSFET 402 by the source-follower operation of the first MOSFET 402.

In the solid-state image sensor compatible with the CMOS manufacturing process, the electric potential of the N+-type semiconductor region 306 that functions as a photoelectric conversion part varies according to the number of accumulated electrons and the variation of the electric potential is output to the second MOSFET 403 via the source of the first MOSFET 402 by the source-follower operation of the first MOSFET 402.

In this case, if the quantity of signal charges is Q, the parasitic capacity of the N+-type semiconductor region 306 that functions as a photoelectric conversion part is C and output voltage is V, V=Q/C. FIG. 13 shows relation among the quantity of incident light, electric potential and output voltage.

However, as shown in FIG. 10, as a photoelectric conversion part is formed by the N+-type semiconductor region 306 in the solid-state image sensor compatible with the CMOS manufacturing process, there is a defect that the parasitic capacity C of the photoelectric conversion part increases as a result even if the area of the photoelectric conversion part is simply increased and the variation V of the electric potential by signal charges cannot be increased by expected quantity.

SUMMARY OF THE INVENTION

The invention is made to solve the problem and particularly, the object is to provide a solid-state image sensor compatible with a CMOS manufacturing process wherein the power conversion efficiency of a photoelectric conversion part when the quantity of light is small is enhanced and the sensitivity can be enhanced.

A first solid-state image sensor according to the invention is based upon a solid-state image sensor provided with a photoelectric conversion part of a conductive type reverse to one conductive type of a semiconductor region, the reverse conductive type of a drain region formed in the semiconductor region and formed opposite to the photoelectric conversion part, MOSFET for control using the reverse conductive type of a region formed between the photoelectric conversion part and the drain region for a channel region for control and characterized in that the solid-state image sensor outputs the variation of the electric potential by electric charges generated in the photoelectric conversion part of the photoelectric conversion part via a source-follower amplifying circuit, and is characterized in that the first solid-state image sensor according to the invention has basic configuration that the photoelectric conversion part has a first photoelectric conversion part and a second photoelectric conversion part, the channel region for control is located between the second photoelectric conversion part and the drain region and MOSFET for setting constant potential using a region between the first photoelectric conversion part and the second photoelectric conversion part for a channel region for setting constant potential is formed between the first photoelectric conversion part and the second photoelectric conversion part. The solid-state image sensor according to the invention and having the basic configuration has the following various characteristics.

First, the first photoelectric conversion part is larger in area than the second photoelectric conversion part.

The potential of the channel region for setting constant potential is between the potential of the channel region for control when the voltage of a high level is applied to the channel region for control and the potential of the channel region for control when the voltage of a low level is applied.

At least one of the drain region, the first photoelectric conversion part and the second photoelectric conversion part is different from the others in the density of impurities and the depth of junction with the semiconductor region, the density of impurities in the drain region is higher than that of the first photoelectric conversion part and the second photoelectric conversion part, the depth of junction between the drain region and the semiconductor region is shallower than that between the first photoelectric conversion part or the second photoelectric conversion part and the semiconductor region and further, concretely, the first photoelectric conversion part and the second photoelectric conversion part are identical in the density of impurities and the depth of junction with the semiconductor region or are different in either of the density of impurities or the depth of junction with the semiconductor region.

The MOSFET for control is a depletion-type transistor in which current flows between the source and the drain even when voltage applied to the gate electrode is zero.

One conductive type of a cap semiconductor layer covers the surface of the first photoelectric conversion part.

The second photoelectric conversion part is connected to the gate of a source-follower transistor forming the source-follower amplifying circuit.

The parasitic capacity of the photoelectric conversion part when a minute signal is input can be reduced by providing the first and second photoelectric conversion parts as described above. Also, a second solid-state image sensor according to the invention is based upon a solid-state image sensor provided with a photoelectric conversion part for converting received light to a signal charge and is characterized in that the photoelectric conversion part is provided with one conductive type of a first semiconductor layer having first, second and third regions, a second conductive type of a second semiconductor layer which is formed in the first region in the first semiconductor layer and to which wiring for taking a signal charge is connected and the second conductive type of a third semiconductor layer formed in the third region in the first semiconductor layer with the second region between opposite to the second semiconductor layer.

Also, a third solid-state image sensor according to the invention is based upon a solid-state image sensor provided with a photoelectric conversion part for converting received light to a signal charge and is characterized in that the photoelectric conversion part is provided with one conductive type of a first semiconductor layer, a second conductive type of a second semiconductor layer which is formed in the first semiconductor layer and to which wiring for taking a signal charge is connected and the second conductive type of a third semiconductor layer formed in the first semiconductor layer apart from the second semiconductor layer.

The parasitic capacity of the photoelectric conversion part viewed from wiring when a minute signal is input can be reduced by forming the semiconductor layer forming the photoelectric conversion part by the plural semiconductor layers as described above.

DETAILED DESCRIPTION OF THE PREFERRED EMBODIMENTS

Figure 1A:
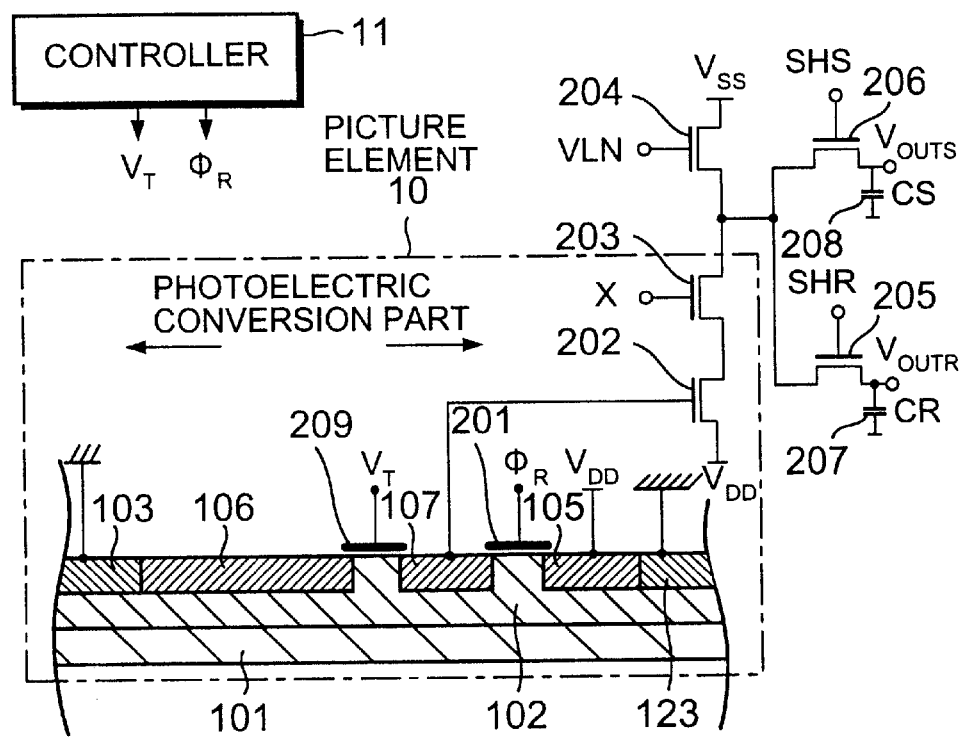
FIG. 1A is a sectional view showing a solid-state image sensor equivalent to a first embodiment of the invention and FIG. 1B is a potential phase diagram.

Next, referring to the drawings, the invention will be described.

Figure 1B:
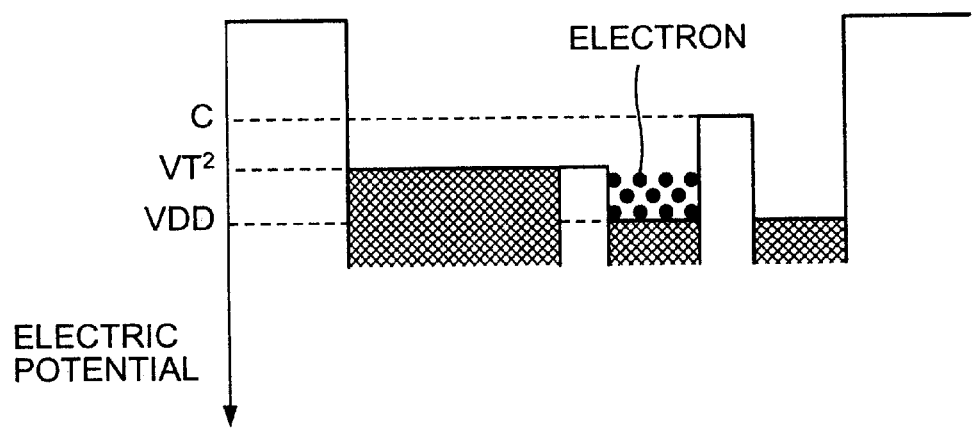
Figure 2A:
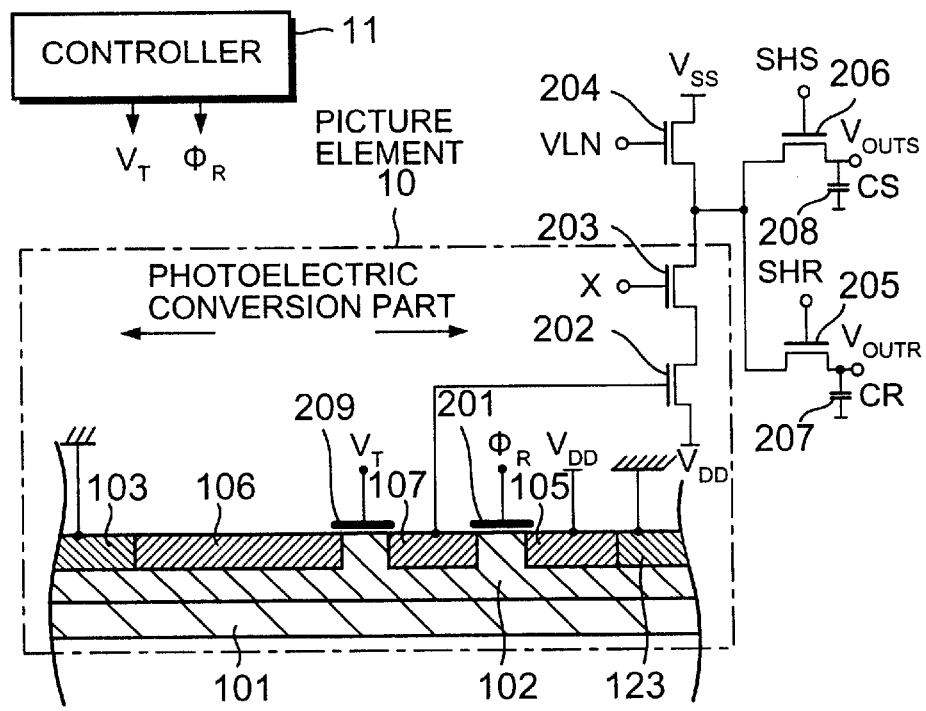
FIG. 2A is a sectional view showing the solid-state image sensor equivalent to the first embodiment of the invention and FIG. 2B is a potential phase diagram.
Figure 2B:
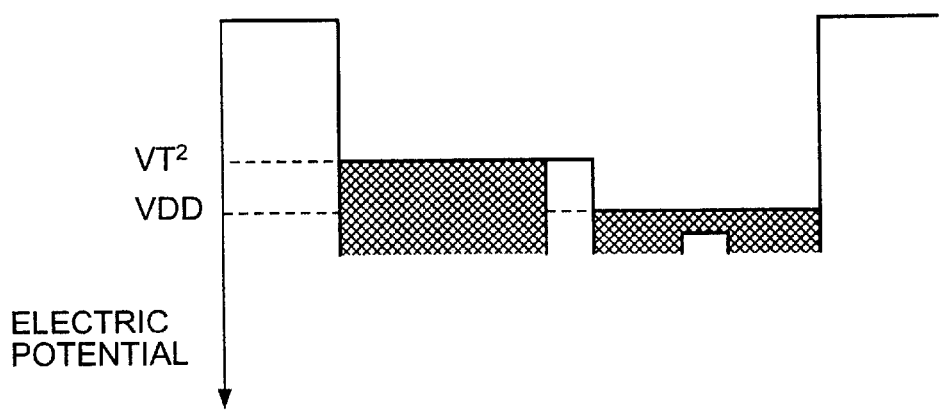
Figure 3:
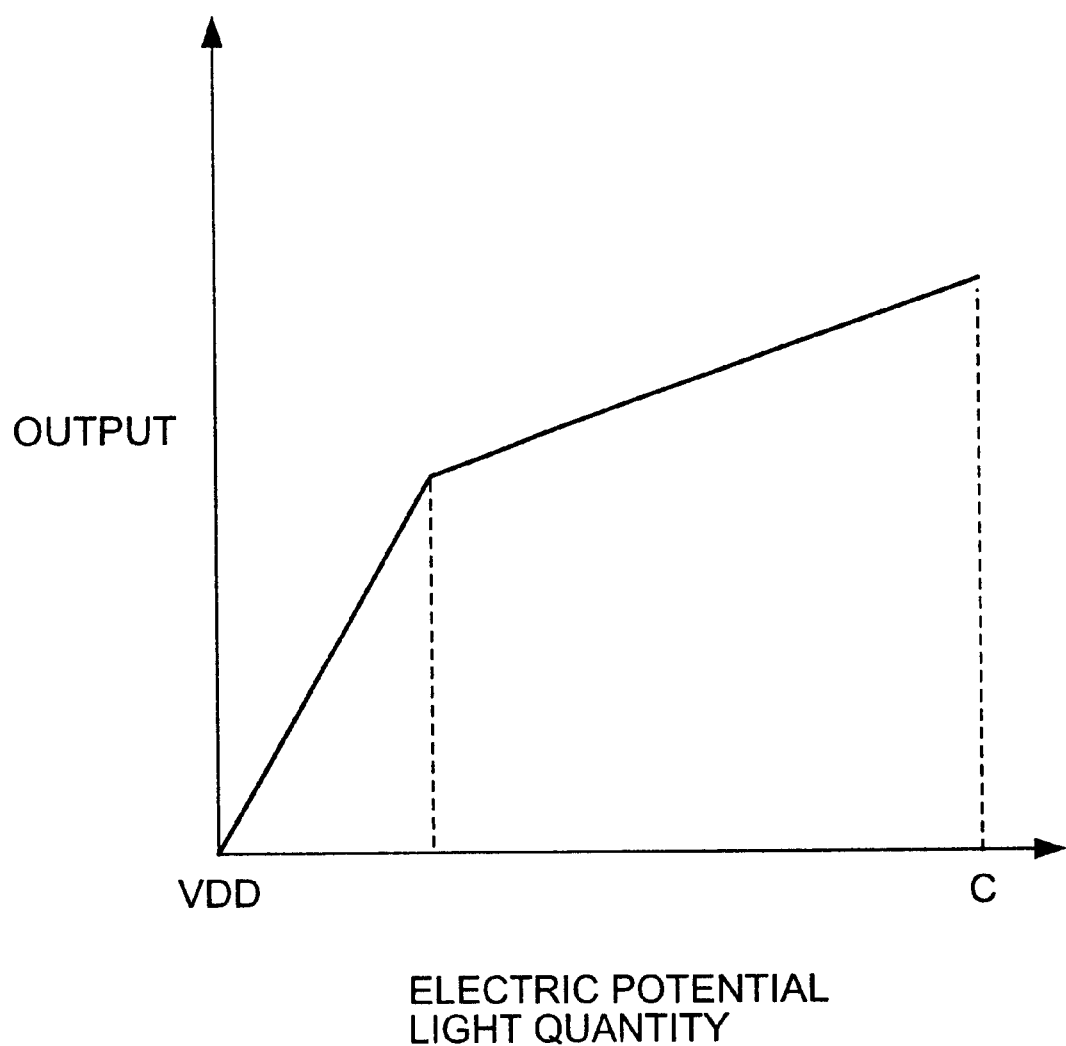
FIG. 3 is a graph showing the dependency upon incident light of the output of the solid-state image sensor according to the invention.

FIG. 1 are a sectional view showing a basic cell of a CMOS sensor equivalent to a first embodiment of the invention and a potential phase diagram while signal charges are accumulated in a photoelectric conversion part in the basic cell. FIG. 2 are a sectional view showing the basic cell of the CMOS sensor equivalent to the first embodiment of the invention and a potential phase diagram when signal charges in the photoelectric conversion part in the basic cell are reset. FIGS. 1A and 2A respectively show a sectional view showing the vicinity of the photoelectric conversion part including MOSFET for control together with a circuit diagram showing a source-follower amplifier and FIGS. 1B and 2B are respectively an electric potential diagram corresponding to the photoelectric conversion part and MOSFET for control respectively shown in FIGS. 1A and 2A.

The basic cell (picture element) of the CMOS sensor is provided with a P-type semiconductor substrate 101, a P-type well layer 102 which is formed inside the P-type semiconductor substrate 101 and a part of which is exposed on the surface of the P-type semiconductor substrate 101, P+-type semiconductor regions 103 and 123 formed on the P-type well layer 102, exposed on the surface of the P-type semiconductor substrate 101 and functioning as an element separating region, MOSFET 201 for control having a gate electrode located opposite to the exposed surface of the P-type well layer 102 exposed on the surface of the P-type semiconductor substrate 101, an N+-type semiconductor region 105 supported by the P-type well layer 102 and the P+-type semiconductor region 123 and functioning as a drain of the MOSFET for control 201, an N+-type semiconductor region 106 as a first conductive type of a first region surrounded by the P-type well layer 102 and the P+-type semiconductor region 103, MOSFET for setting constant potential 209 formed next to the first region 106 and having a gate electrode located opposite to the exposed surface of the P-type well layer 102 exposed on the surface of the P-type semiconductor substrate 101, an N+-type semiconductor region 107 as the first conductive type of a second region formed between the MOSFET for control 201 and the MOSFET for setting constant potential 209, first MOSFET 202 functioning as a source-follower amplifier and second MOSFET 203 functioning a horizontal selecting switch. The three semiconductor regions of the N+-type semiconductor region 105, the N+-type semiconductor region 106 and the N+-type semiconductor region 107 maybe also formed simultaneously, that is, at the same density of impurities and the same depth of a junction to shorten the manufacturing process, however, at least one of the three semiconductor regions may be also formed in another process so that the density of impurities and the depth of a junction are different from those of other semiconductor regions. Though it is not shown, the basic cell shall be arranged linearly or in a matrix.

A controller 11 for supplying control voltage Vt to the gate of the transistor for setting constant potential 209 and supplying a reset pulse $\phi R$ to the gate of the MOSFET for control 201 in resetting is also provided.

The basic cell of the CMOS sensor is connected to an external circuit via the second MOSFET 203.

The external circuit is composed of third load MOSFET 204 functioning as a source-follower amplifier, a capacitor for accumulating dark output 207 connected to a source or a drain of MOSFET for transferring dark output 205, MOSFET for transferring light output 206 and a capacitor for accumulating light output 208 connected to a source or a drain of the MOSFET for transferring light output 206.

The second MOSFET 203 is connected to the third load MOSFET 204. The MOSFET for transferring dark output 205 and the MOSFET for transferring light output 206 are connected to a node between the second MOSFET 203 and the third load MOSFET 204.

The first MOSFET 202, the second MOSFET 203 and the third load MOSFET 204 are connected in series between line sources VDD and VSS, and the first region (the N+-type semiconductor region) 106 is connected to the gate electrode of the first MOSFET 202.

The P+-type semiconductor regions 103 and 123 are grounded and the N+-type semiconductor region 105 is connected to a line source VDD. Electric potential under the MOSFET for setting constant potential 209 is controlled by control voltage Vt from the controller 11 so that the electric potential is lower than electric potential under the MOSFET for control 201 when the voltage of a low level is applied to the MOSFET for control 201 and is higher than electric potential under the MOSFET for control 201 when the voltage of a high level is applied to the MOSFET for control 201.

Such relation of potential can be realized when source voltage VDD is 3.3 V, the voltage when the voltage of a high level is applied to the MOSFET for control 201 is 5.0 V, the voltage when the voltage of a low level is applied is 1.0 V and voltage applied to the MOSFET for setting constant potential 209 is 3.3 V for example.

Figure 10A:
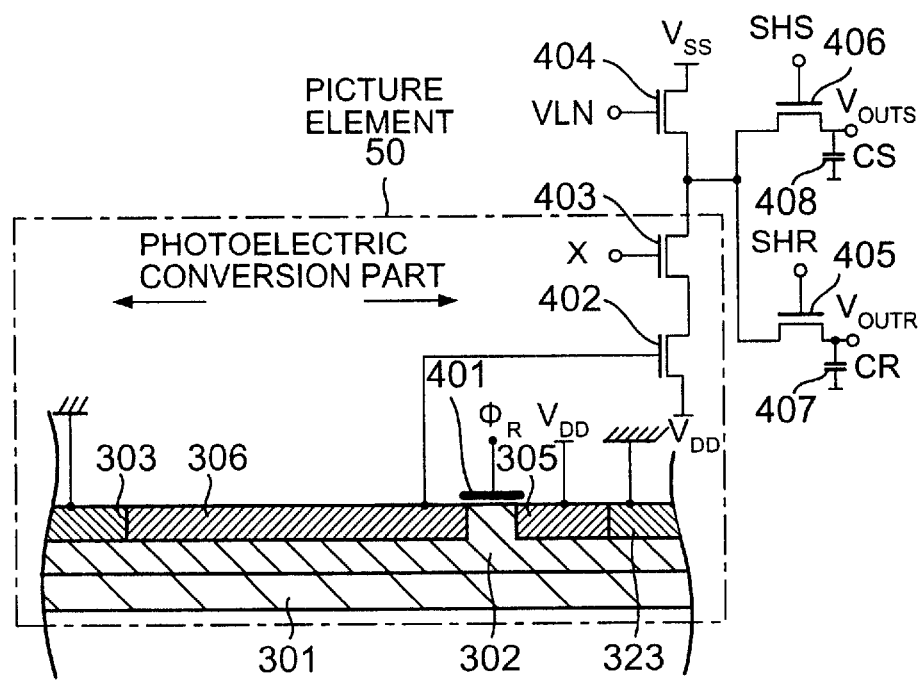
FIG. 10A is a sectional view showing a conventional type solid-state image sensor and FIG. 10B is a potential phase diagram.
Figure 10B:
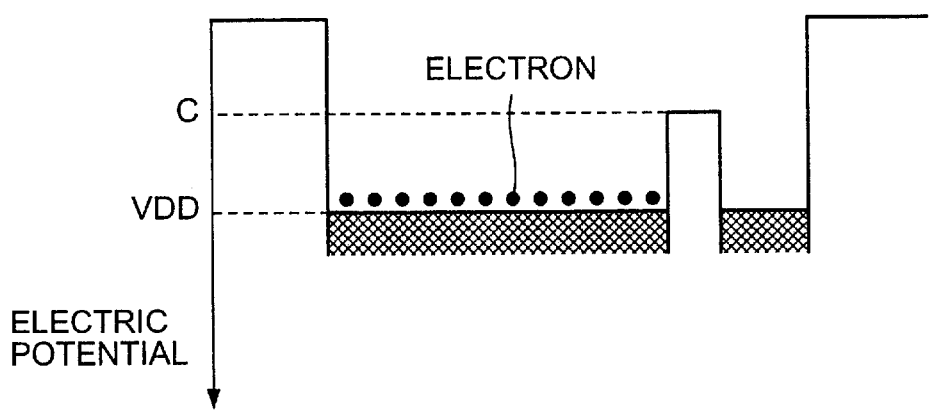
Figure 11A:
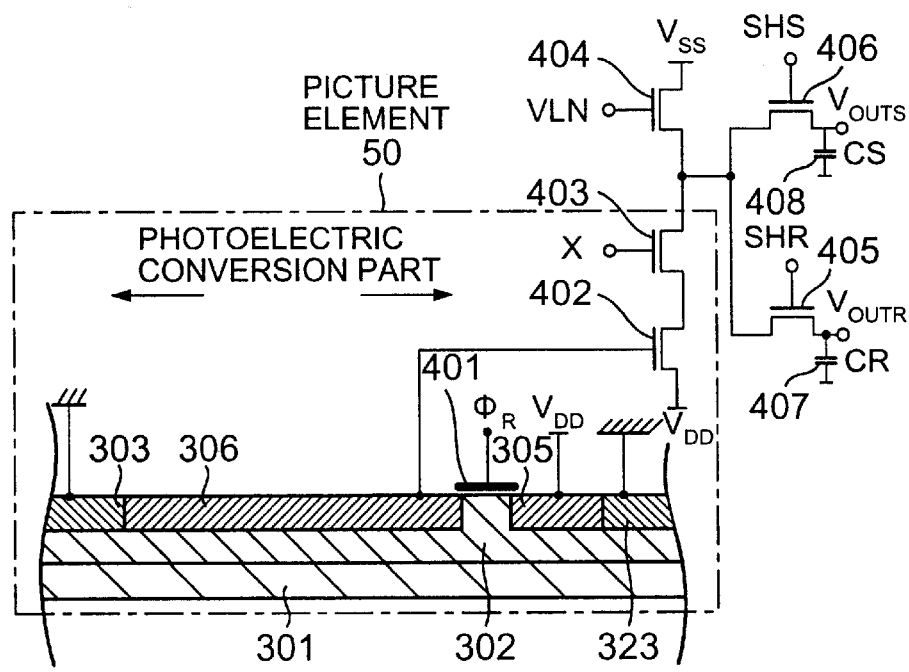
FIG. 11A is a sectional view showing the conventional type solid-state image sensor and FIG. 11B is a potential phase diagram.
Figure 11B:
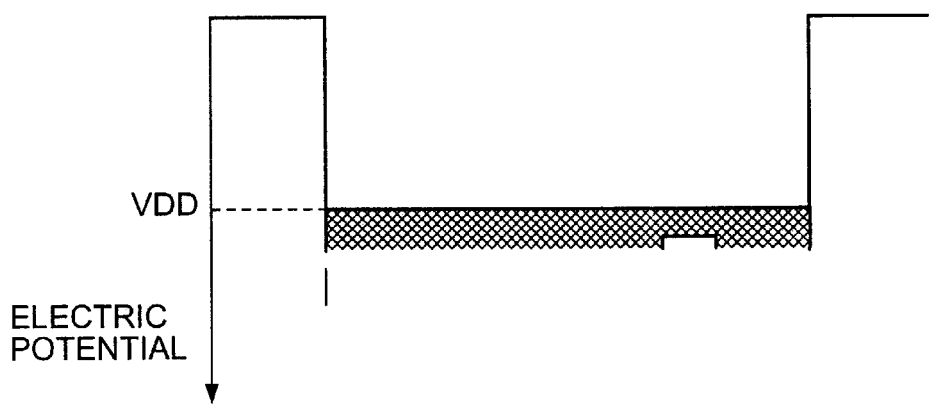
Figure 12:
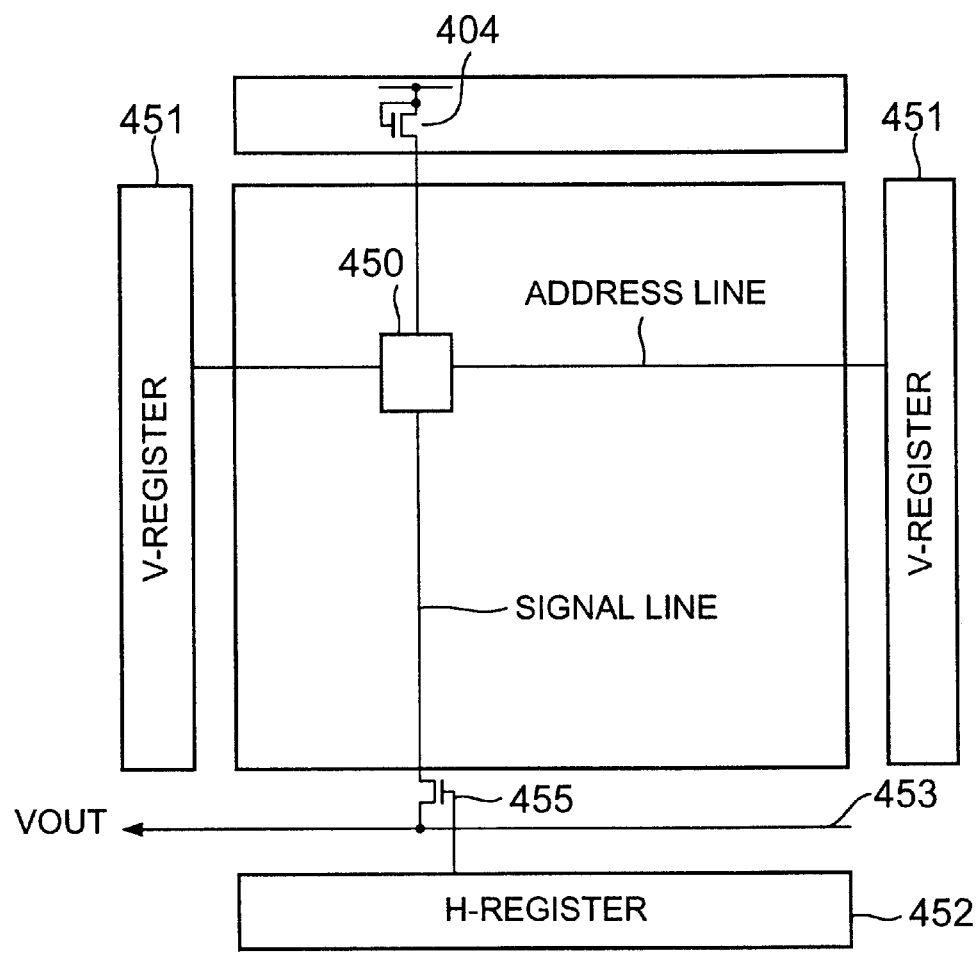
FIG. 12 is a block diagram showing an active-type XY addressing solid-state image sensor.
Figure 12:
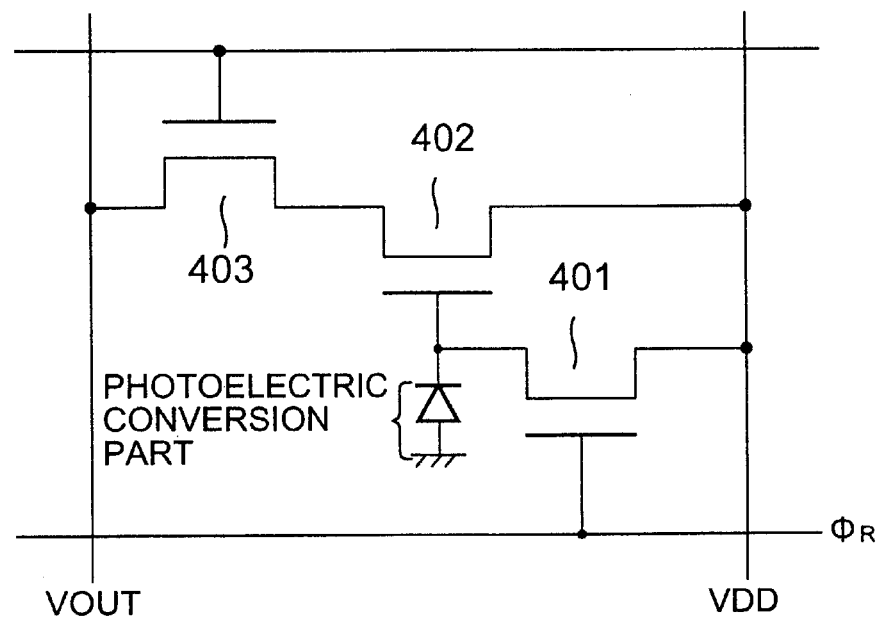
Figure 13:
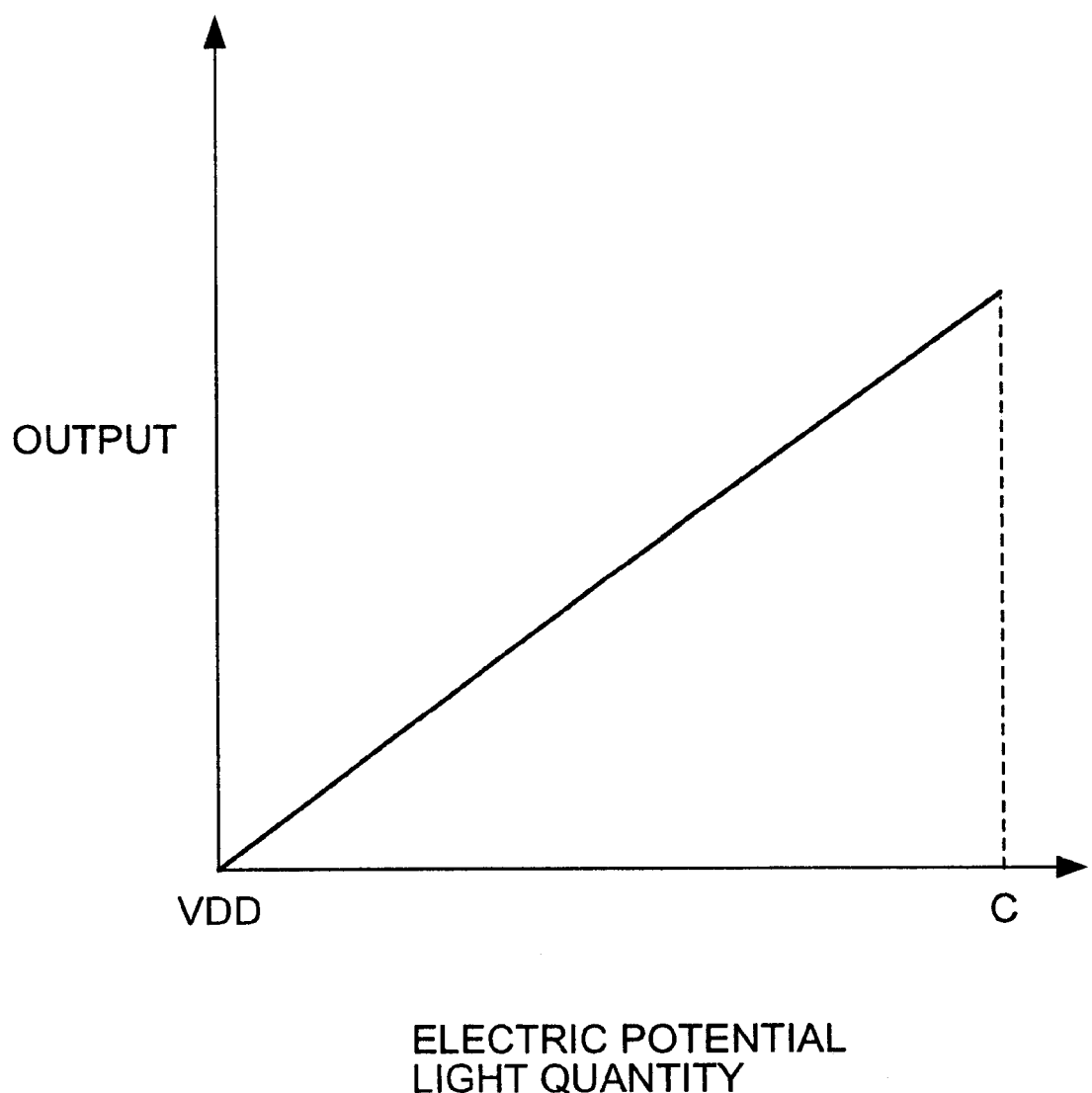
FIG. 13 is a graph showing the dependency upon incident light of the output of the conventional type solid-state image sensor.

The basic cell of the CMOS sensor equivalent to this embodiment is different from the basic cell of the CMOS sensor shown in FIGS. 10 and 11 in that as shown in FIG. 1, the photoelectric conversion part in this embodiment is formed by the N+-type semiconductor region 106 as a first conductive type of a first region surrounded by the P-type well layer 102 and the P+-type semiconductor region 103, the MOSFET for setting constant potential 209 formed next to the first region 106 and the N+-type semiconductor region 107 as the first conductive type of a second region formed between the MOSFET for control 201 and the MOSFET for setting constant potential 209.

The first conductive type of the first region 106, the second region 107 and the MOSFET for setting constant potential 209 form the photoelectric conversion part. Of these, the first region 106 and the second region 107 function as the photoelectric conversion part. The electric potential of the second region 107 is lower than that of the first region 106. Therefore, in a period in which signal charges are accumulated, signal charges photoelectrically converted in the first region 106 are accumulated in the second region 107.

As shown in FIG. 1B, when signal charges are accumulated in only the second region 107, that is, when the quantity of electric charges is small, the parasitic capacity of the photoelectric conversion part viewed from the gate of the MOSFET 202 is only the parasitic capacity C1 of the second region. In the meantime, when signal charges are accumulated in the second region 107 and the first region 106, that is, when the quantity of charges is much, the parasitic capacity of the photoelectric conversion part viewed from the gate of the MOSFET 202 is equivalent to parasitic capacity C2 acquired by adding the parasitic capacity of the first region to that of the second region.

Therefore, a two-stage incident light quantity-output voltage characteristic can be acquired for the quantity of incident light. When electric potential is at a first stage from VDD to VT', that is, when signal charges are accumulated in only the second region 107, the parasitic capacity is only C1, however, as signal charges photoelectrically converted in the first region 106 are also included in signal charges accumulated in the second region, the sensitivity at low illuminance can be enhanced. In case electric potential exceeds VT', the first region and the second region are both used for areas for accumulating photoelectrically converted signal charges and the parasitic capacity is equivalent to C2.

It is known that as V=Q/C, the variation of voltage for all minute charges is increased if the parasitic capacity of the second region 107 is reduced.

Therefore, in case the first conductive type of the second region 107 is smaller than the first conductive type of the first region 106, the sensitivity at low illuminance can be more enhanced.

Though it is not shown, a region except the photoelectric conversion part is shielded by a light shielding film.

For the MOSFET for control 201 and the MOSFET for setting constant potential 209 in this embodiment, nothing is doped into a channel for controlling a threshold, however, even if something is doped into a channel for controlling a threshold, it need scarcely be said that this embodiment can be similarly applied.

Figure 4A:
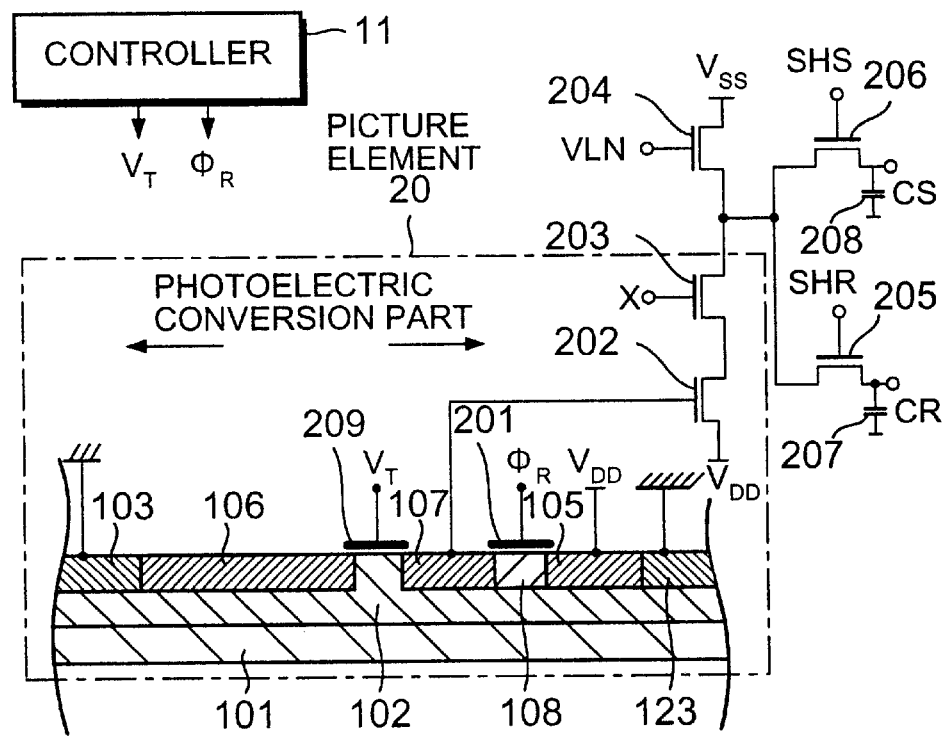
FIG. 4A is a sectional view showing a solid-state image sensor equivalent to a second embodiment of the invention and FIG. 4B is a potential phase diagram.
Figure 4B:
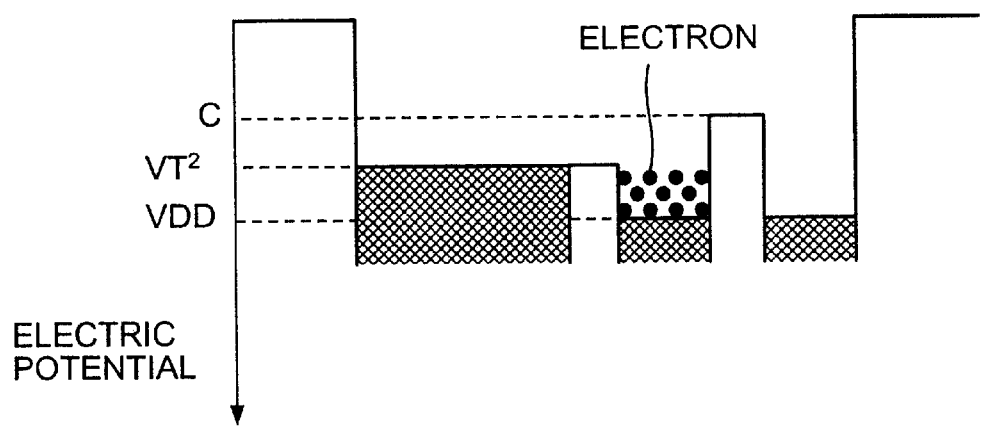
Figure 5A:
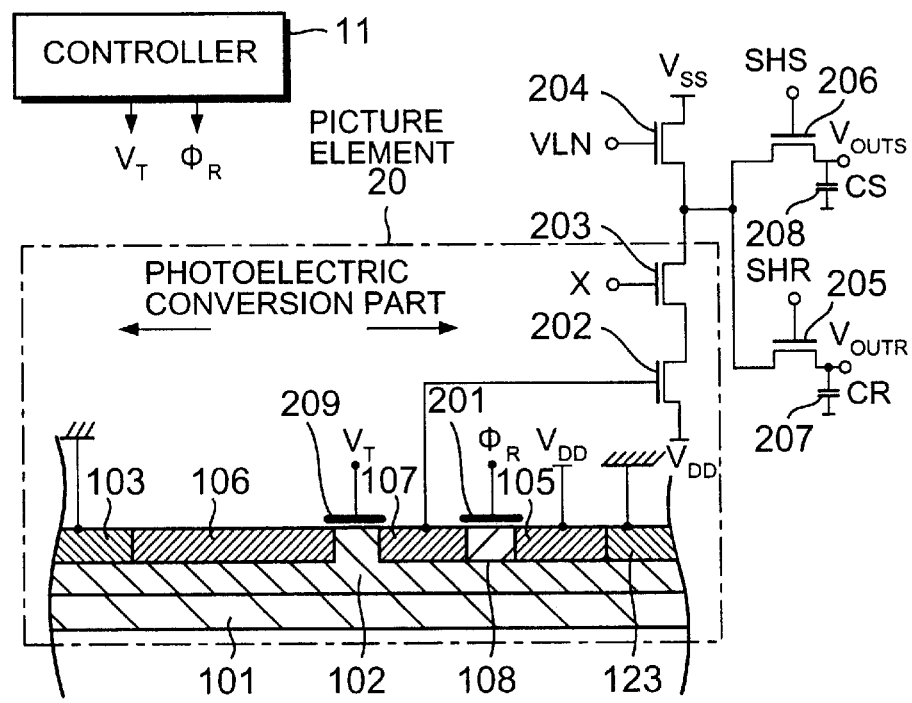
FIG. 5A is a sectional view showing the solid-state image sensor equivalent to the second embodiment of the invention and FIG. 5B is a potential phase diagram.
Figure 5B:
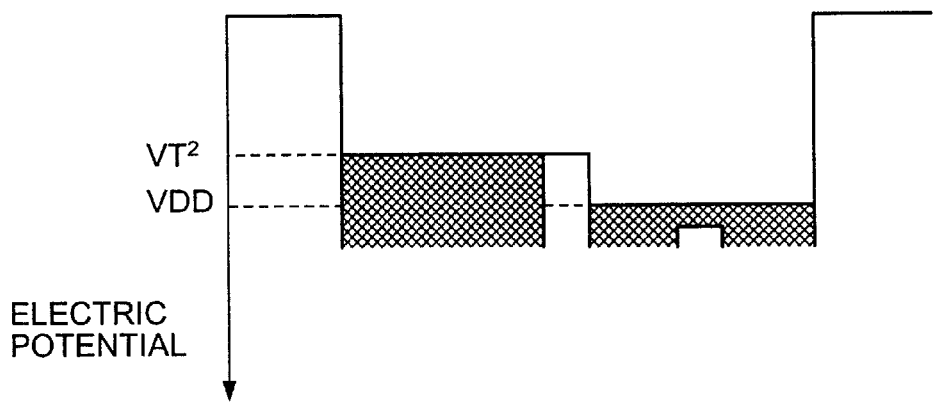

Next, referring to FIGS. 4 and 5, a solid-state image sensor equivalent to a second embodiment of the invention will be described. FIG. 4 are a sectional view showing a basic cell of a CMOS sensor equivalent to the second embodiment of the invention and a potential phase diagram while signal charges are accumulated in a photoelectric conversion part in the basic cell and FIG. 5 are a sectional view showing the basic cell of the CMOS sensor equivalent to the second embodiment of the invention and a potential phase diagram when signal charges in the photoelectric conversion part in the basic cell are reset.

The CMOS sensor equivalent to this embodiment is different from the CMOS sensor equivalent to the first embodiment in that MOSFET for control 201 is a depletion type and a channel region 108 of the MOSFET for control 201 has the same conductive type (an N type) as those of an N+-type semiconductor region 105 and a second region 107. As the configuration except this is the same as that in the first embodiment, the description is omitted.

Therefore, if source voltage VDD is 3.3 V, the voltage of a high level applied to the MOSFET for control 201 is 3.3 V, the applied voltage of a low level is 0 V and voltage applied to MOSFET for setting constant potential 209 is 3.3 V, potential relation under the MOSFET for setting constant potential 209 and the MOSFET for control 201 can be realized without using plural voltage.

Figure 6A:
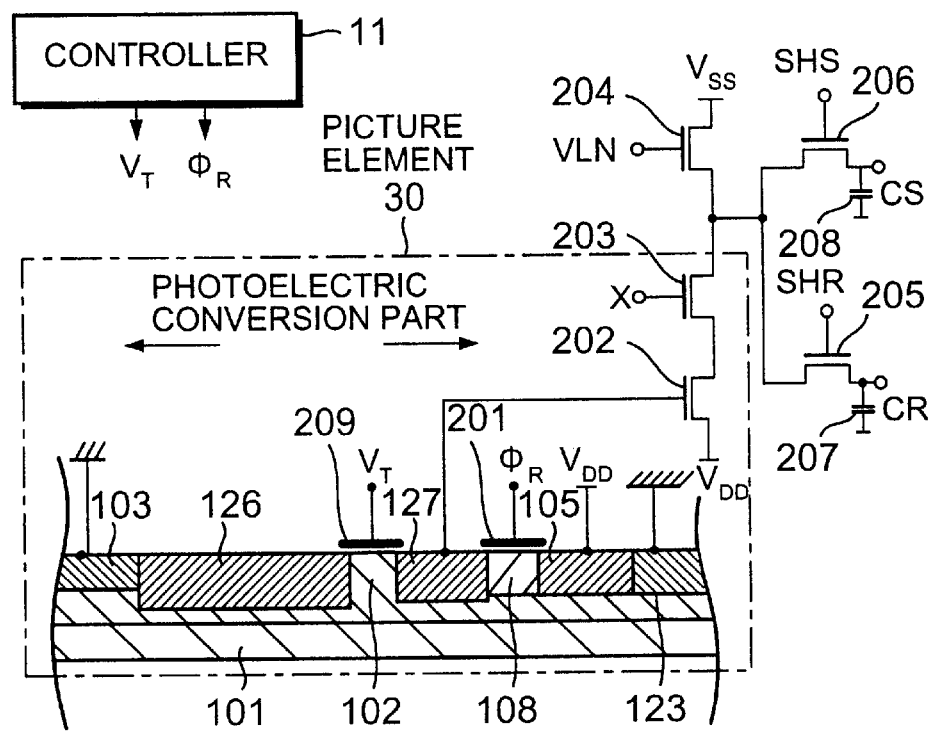
FIG. 6A is a sectional view showing a solid-state image sensor equivalent to a third embodiment of the invention and FIG. 6B is a potential phase diagram.
Figure 6B:
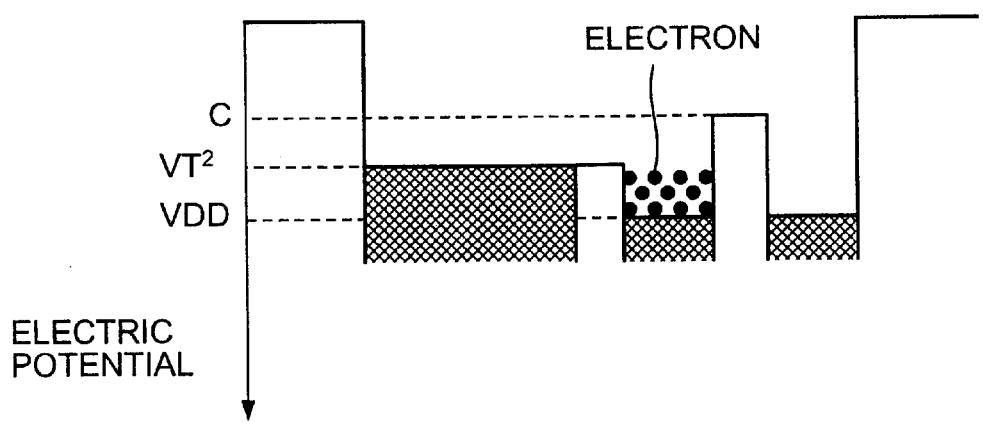
Figure 7A:
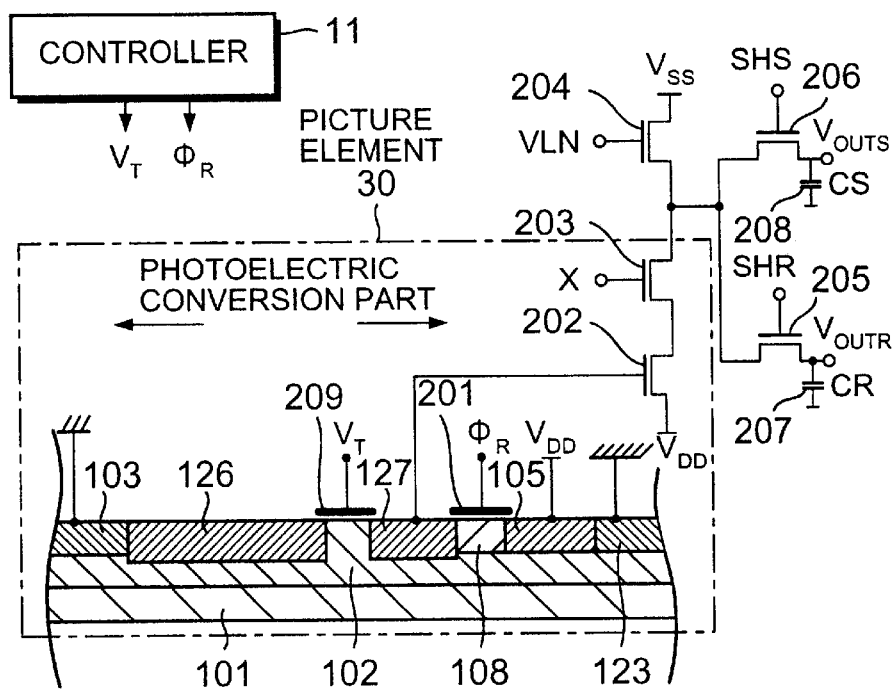
FIG. 7A is a sectional view showing the solid-state image sensor equivalent to the third embodiment of the invention and FIG. 7B is a potential phase diagram.
Figure 7B:
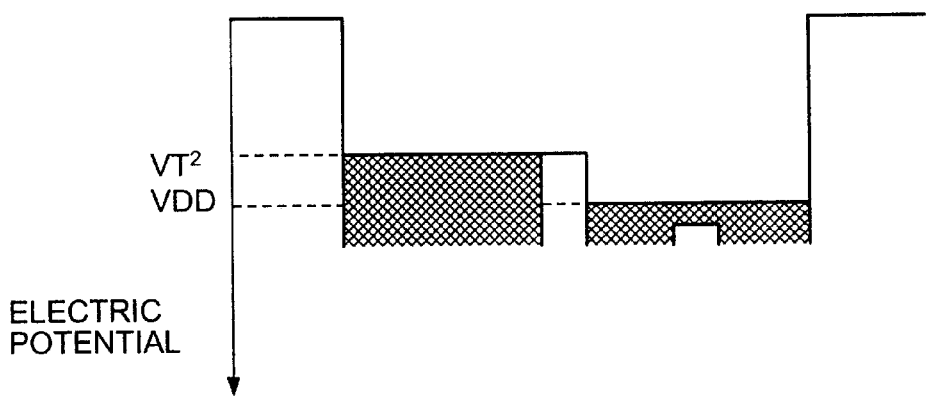

Next, referring to FIGS. 6 and 7, a solid-state image sensor equivalent to a third embodiment of the invention will be described. FIG. 6 are a sectional view showing a basic cell of a CMOS sensor equivalent to the third embodiment of the invention and a potential phase diagram while signal charges are accumulated in a photoelectric conversion part in the basic cell and FIG. 7 are a sectional view showing the basic cell of the CMOS sensor equivalent to the third embodiment of the invention and a potential phase diagram when signal charges in the photoelectric conversion part in the basic cell are reset.

The CMOS sensor equivalent to this embodiment is different from the CMOS sensor equivalent to the first embodiment in the density of impurities and the depth of a junction in an N+-type semiconductor region 126 as a first conductive type of a first region, an N+-type semiconductor region 127 as the first conductive type of a second region and an N+-type semiconductor region 105 that functions as a drain of MOSFET for control 201. As a location using the same reference number is identical to that described in the first embodiment, the description is omitted.

Concretely, the density of impurities in the N+-type semiconductor region 126 as the first conductive type of the first region and the N+-type semiconductor region 127 as the first conductive type of the second region is lower and the depth of a junction is deeper, compared with the density of impurities and the dept of a junction in the N+-type semiconductor region 105 that functions as a drain of the MOSFET for control 201. Therefore, in case the junction is deep, the density of impurities can be reduced and when the density of impurities is reduced, parasitic capacity can be reduced. The electric potential of the N+-type semiconductor region 126 may be also lower than that of the N+-type semiconductor region 127. Therefore, if the depth of a junction in the N+-type semiconductor regions 126 and 127 is identical, the density of impurities in the N+-type semiconductor region 126 can be reduced. The configuration except this is identical to that of the CMOS sensor equivalent to the second embodiment.

Therefore, as the sensitivity is enhanced and parasitic capacity C can be reduced because a depletion layer formed in a junction among a P-type well layer 102, the N+-type semiconductor region 126 as the first conductive type of the first region and the N+-type semiconductor region 127 as the first conductive type of the second region can be extended, potential variation V by signal charges can be increased and an output conversion efficiency can be enhanced.

In this embodiment, the three regions of the N+-type semiconductor region 126 as the first conductive type of the first region, the N+-type semiconductor region 127 as the first conductive type of the second region and the N+-type semiconductor region 105 that functions as a drain of the MOSFET for control 201 are different in the density of impurities and the depth of a junction, however, the first conductive type of the first region 126 and the first conductive type of the second region 127 may be also identical in the density of impurities and the depth of a junction and it need scarcely be said that even if they are different in only one of the density of impurities and the depth of a junction, this embodiment can be applied to a solid-state image sensor as a transformed example.

Further, a channel region 108 of the MOSFET for control 201 in the third embodiment is a depletion type as in the second embodiment, however, it need scarcely be said that the same effect as effect acquired in this embodiment is acquired even if the channel region is an enhancement type.

Figure 8A:
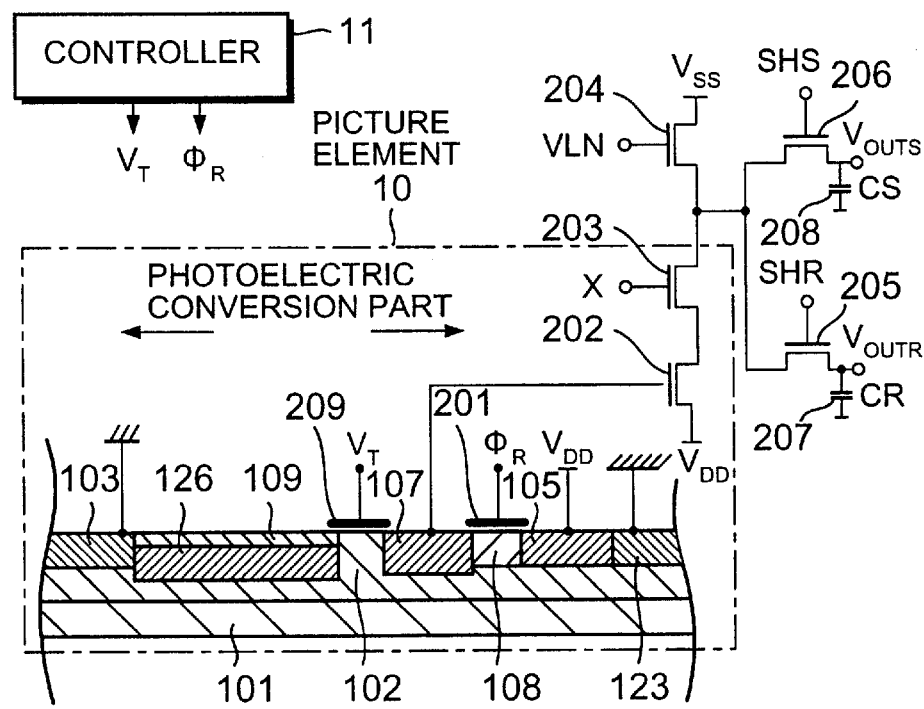
FIG. 8A is a sectional view showing a solid-state image sensor equivalent to a fourth embodiment of the invention and FIG. 8B is a potential phase diagram.
Figure 8B:
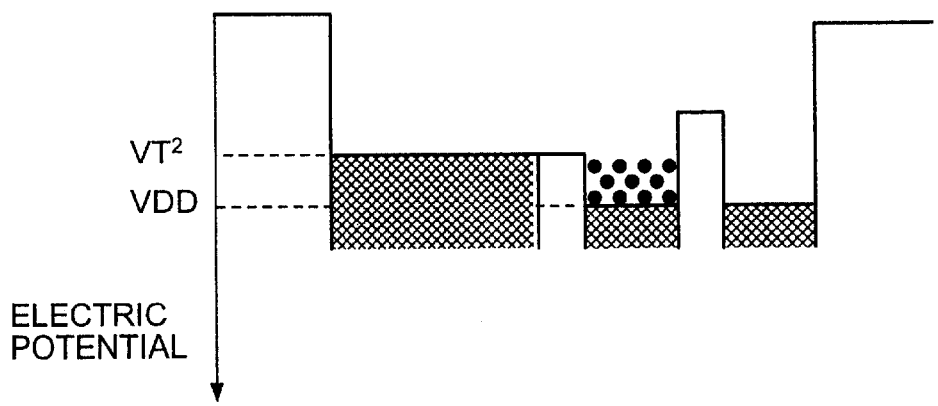
Figure 9A:
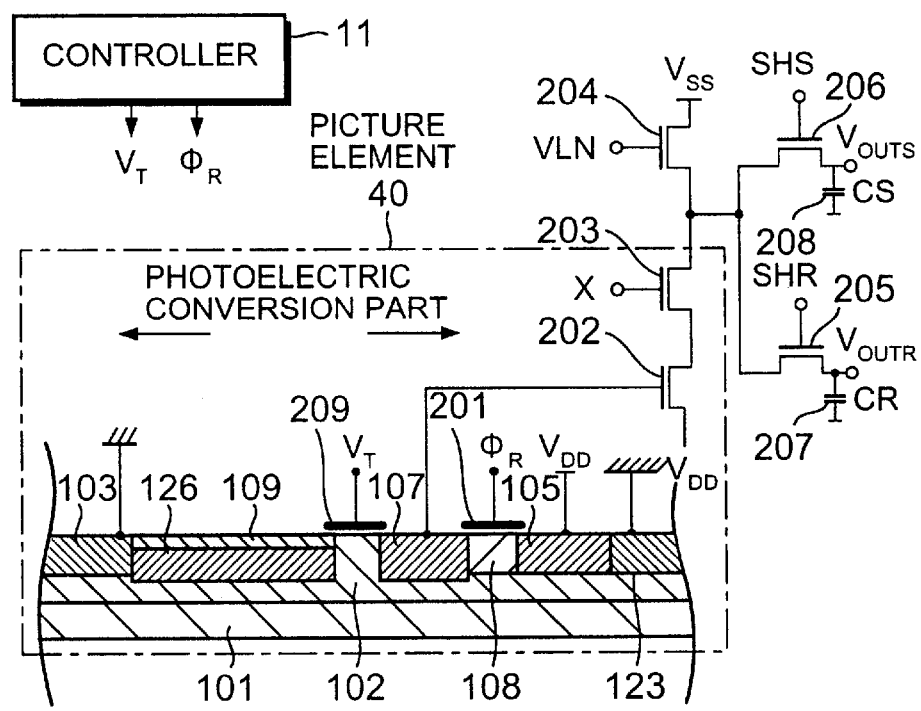
FIG. 9A is a sectional view showing the solid-state image sensor equivalent to the fourth embodiment of the invention and FIG. 9B is a potential phase diagram.
Figure 9B:
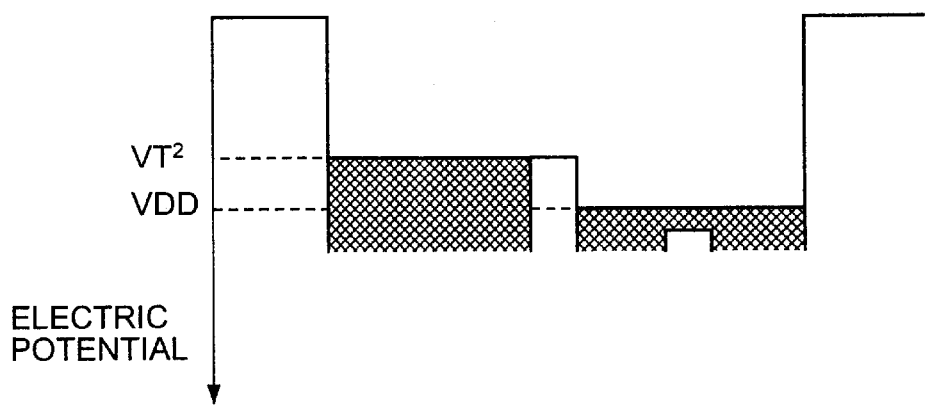

Next, referring to FIGS. 8 and 9, a solid-state image sensor equivalent to a fourth embodiment of the invention will be described. FIG. 8 are a sectional view showing a basic cell of a CMOS sensor equivalent to the fourth embodiment of the, invention and a potential phase diagram while signal charges are accumulated in a photoelectric conversion part in the basic cell and FIG. 9 are a sectional view showing the basic cell of the CMOS sensor equivalent to the fourth embodiment of the invention and a potential phase diagram when signal charges in the photoelectric conversion part in the basic cell are reset.

The CMOS sensor equivalent to this embodiment is different from the CMOS sensor equivalent to the first embodiment in that a P+-type semiconductor region 109 kept at reference potential is formed on the surface of an N+-type semiconductor region 126 as a first conductive type of a first region. As the configuration except this is identical to that of the CMOS sensor equivalent to the third embodiment, the description is omitted.

Therefore, as current caused from an interface between silicon and an oxide film can be made to vanish by recombination and a noise component not depending upon photoelectric conversion can be reduced, signal-to-noise ratio can be enhanced.

In this embodiment, a P+-type semiconductor region 109 is formed on the surface of the N+-type semiconductor region 126 in the third embodiment, however, in addition, it is needless to say that a transformed example that a P+-type semiconductor region is formed on the surface of the N+-type semiconductor region 106 in the first and second embodiments as in this embodiment is conceivable and in these transformed examples, the similar effect to that in the fourth embodiment is acquired.

Further, the first to fourth embodiments are not limited to the above-mentioned range and may be varied as follows.

For example, in each embodiment, the polarity of the semiconductor region can be also reversed from an N type to a as P type and vice versa.

Further, in each embodiment, the P-type semiconductor substrate is used, however, an N-type semiconductor substrate can be also used.

As described above, in the solid-state image sensor according to the invention, for the photoelectric conversion part in this embodiment, the conventional type photoelectric conversion part surrounded by the P-type well layer and the P+-type semiconductor region is divided into the N+-type semiconductor region as a first conductive type of a first region, the channel region of the MOSFET for setting constant potential formed next to the first region and the N+-type semiconductor region as the first conductive type of a second region, the MOSFET for setting constant potential using the P-type well layer between the first and second regions for a channel region is provided, a two-stage incident light quantity-output voltage characteristic can be acquired for the quantity of incident light by using the P-type well layer between the second region and the drain of the conventional type MOSFET of control for the channel region of the MOSFET for control and the sensitivity at low illuminance can be enhanced.

In case the MOSFET for control is the depletion type, potential relation between the MOSFET for setting constant potential and the MOSFET for control can be realized without using plural voltage.

Also, the depletion layer formed in a joint among the P-type well layer, the first conductive type of the first region and the first conductive type of the second region can be extended by setting so that the density of impurities and the depth of junction in the first conductive type of the first region and the first conductive type of the second region are lower than the density of impurities and are deeper than the depth of junction respectively of the drain of the MOSFET for control, the sensitivity is enhanced, the parasitic capacity C can be reduced, potential variation V by a signal charge can be increased and the output conversion efficiency can be enhanced.

Further, the P+-type semiconductor region kept at reference potential is formed on the surface of the N-type semiconductor region as the first conductive type of the first region. Therefore, as current caused from an interface between silicon and the oxide film can be made to vanish by recombination and a noise component not depending upon photoelectric conversion can be reduced, signal-to-noise ratio can be enhanced.

What is claimed is:

1. A solid-state image sensor based upon a solid-state image sensor provided with a photoelectric conversion part of a conductive type reverse to one conductive type of a semiconductor region, the reverse conductive type of a drain region formed in the semiconductor region and formed opposite to the photoelectric conversion part and MOSFET for control using the reverse conductive type of a region formed between the photoelectric conversion part and the drain region for a channel region for control for outputting the variation of the electric potential of the photoelectric conversion part by electric charges generated in the photoelectric conversion part via a source-follower amplifying circuit, wherein:

the photoelectric conversion part is provided with a first photoelectric conversion part and a second photoelectric conversion part;

the channel region for control is located between the second photoelectric conversion part and the drain region; and MOSFET for setting constant potential using a region between the first photoelectric conversion part and the second photoelectric conversion part for a channel region for setting constant potential is formed between the first photoelectric conversion part and the second photoelectric conversion part.

2. A solid-state image sensor according to claim 1, wherein:

the first photoelectric conversion part is larger in area than the second photoelectric conversion part.

3. A solid-state image sensor according to claim 1, wherein:

the potential of the channel region for setting constant potential is between the potential of the channel region for control when the voltage of a high level is applied to the channel region for control and the potential of the channel region for control when the voltage of a low level is applied.

4. A solid-state image sensor according to claim 1, wherein:

at least one of the drain region, the first photoelectric conversion part and the second photoelectric conversion part different from the others in the density of impurities and the depth of junction with the semiconductor region.

5. A solid-state image sensor according to claim 4, wherein:

the density of impurities in the drain region is higher than that in the first photoelectric conversion part and the second photoelectric conversion part; and the depth of junction between the drain region and the semiconductor region is shallower than that between the first photoelectric conversion part or the second photoelectric conversion part and the semiconductor region.

6. A solid-state image sensor according to claim 5, wherein:

the first photoelectric conversion part and the second photoelectric conversion part are identical in the density of impurities and the depth of junction with the semiconductor region or are different in either of the density of impurities or the depth of junction with the semiconductor region.

7. A solid-state image sensor according to claim 1, wherein:

the MOSFET for control is a depletion-type transistor in which current flows between the source and the drain even when voltage applied to the gate electrode is zero.

8. A solid-state image sensor according to claim 1, wherein:

one conductive type of a cap semiconductor layer covers the surface of the first photoelectric conversion part.

9. A solid-state image sensor according to claim 1, wherein:

the second photoelectric conversion part is connected to the gate of a source-follower transistor forming the source-follower amplifying circuit.

10. A solid-state image sensor provided with a photoelectric conversion part for converting received light to a signal charge, wherein:

the photoelectric conversion part is provided with one conductive type of a first semiconductor layer having first, second and third regions, a second conductive type of a second semiconductor layer which is formed in the first region in the first semiconductor layer and to which wiring for taking a signal charge is connected and the second conductive type of a third semiconductor layer formed in the third region in the first semiconductor layer with the second region between opposite to the second semiconductor layer.

11. A solid-state image sensor according to claim 10, wherein:

a gate electrode is formed on the second region in the first semiconductor layer; and the electric potential of the third semiconductor layer is controlled by control voltage applied to the gate electrode.

12. A solid-state image sensor according to claim 10, wherein:

the third semiconductor layer is larger in area than the second semiconductor layer.

13. A solid-state image sensor according to claim 10, comprising:

the second conductive type of a fourth semiconductor layer formed in a fifth region with an adjacent fourth region between in the first region on the first semiconductor layer with the fourth region between opposite to the second semiconductor layer and connected to fixed electric potential.

14. A solid-state image sensor according to claim 13, wherein:

the second and third semiconductor layers are formed so that they are deeper than the fourth semiconductor layer.

15. A solid-state image sensor according to claim 13, wherein:

the density of impurities in the second and third semiconductor layers is lower than that in the fourth semiconductor layer.

16. A solid-state image sensor according to claim 15, wherein:

the density of impurities in the third semiconductor layer is lower than that in the second semiconductor layer.

17. A solid-state image sensor according to claim 10, wherein:

one conductive type of the fifth semiconductor layer is formed on the third semiconductor layer.

18. A solid-state image sensor according to claim 17, wherein:

the fifth semiconductor layer is connected to fixed electric potential.

19. A solid-state image sensor provided with a photoelectric conversion part for converting received light to a signal charge, wherein:

the photoelectric conversion part is provided with one conductive type of a first semiconductor layer, a second conductive type of a second semiconductor layer which is formed in the first semiconductor layer and to which wiring for taking a signal charge is connected and the second conductive type of a third semiconductor layer formed in the first semiconductor layer apart from the second semiconductor layer.

20. A solid-state image sensor according to claim 19, wherein:

a gate electrode is formed on the first semiconductor layer between the second semiconductor layer and the third semiconductor layer.

* * * * *

UNITED STATES PATENT AND TRADEMARK OFFICE
CERTIFICATE OF CORRECTION

PATENT NO. : 6,525,355 B2
DATED : February 25, 2003
INVENTOR(S) : Furumiya et al.

It is certified that error appears in the above-identified patent and that said Letters Patent is hereby corrected as shown below:

Column 11,
Line 13, "part different" should be -- part is different --.

Signed and Sealed this

Twenty-fourth Day of August, 2004

JON W. DUDAS
*Director of the United States Patent and Trademark Office*